(12) United States Patent
Yu

(10) Patent No.: US 6,885,723 B2
(45) Date of Patent: Apr. 26, 2005

(54) SHIFT-REGISTER CIRCUIT

(75) Inventor: Jian-Shen Yu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/406,063

(22) Filed: Apr. 2, 2003

(65) Prior Publication Data

US 2004/0032926 A1 Feb. 19, 2004

(30) Foreign Application Priority Data

Aug. 13, 2002 (TW) ........................................ 91118153 A

(51) Int. Cl.[7] .............................................. G11C 19/00
(52) U.S. Cl. .............................. 377/78; 377/79; 377/81
(58) Field of Search ................................ 377/78, 79, 81

(56) References Cited

U.S. PATENT DOCUMENTS

| | | | | |
|---|---|---|---|---|
| 5,103,116 A | * | 4/1992 | Sivilotti et al. ................ | 377/79 |
| 5,170,074 A | * | 12/1992 | Aoki ........................... | 327/203 |
| 5,434,899 A | | 7/1995 | Huq et al. ..................... | 377/78 |

* cited by examiner

Primary Examiner—Margaret R. Wambach
(74) Attorney, Agent, or Firm—Ladas & Parry LLP

(57) ABSTRACT

A shift-register circuit. The PMOS transistor includes a first gate coupled to an inverse output signal output from a previous-stage shift-register unit, a first drain, and a first source coupled to an output signal output from the previous-stage shift-register unit. The first NMOS transistor includes a second gate coupled to the first drain, a second drain coupled to the clock signal, and a second source. The capacitor is coupled between the second gate and the second source. The second NMOS transistor includes a third gate coupled to the first drain, a third drain coupled to the inverse clock signal, and a third source. The third NMOS transistor includes a fourth gate coupled to the first gate, a fourth drain coupled to the second gate, and a fourth source. The fourth NMOS transistor includes a fifth gate coupled to the first source, a fifth drain coupled to the second source, and a fifth source coupled to the ground voltage level. The fifth NMOS transistor having a sixth gate coupled to the third source, a sixth drain coupled to the fourth source, and a sixth source coupled to the ground voltage level. The first inverter acts as an inverse output terminal and is coupled to the second source for outputting an inverse output signal. The second inverter acts as an output terminal and is coupled to the first inverter for outputting an output signal.

8 Claims, 4 Drawing Sheets

US 6,885,723 B2

SHIFT-REGISTER CIRCUIT

BACKGROUND OF THE INVENTION

1. Field of the Invention

The present invention relates in general to a shift-register circuit. In particular, the present invention relates to a shift-register circuit for liquid crystal display.

2. Description of the Related Art

FIG. 1 shows a conventional shift-register circuit as disclosed by U.S. Pat. No. 5,434,899 of Huq in 1995. FIG. 1 only shows a single shift-register unit, although a plurality of shift-register units compose a shift-register circuit. The input signal from the input terminal INPUT switches the NMOS transistor 12 through the NMOS transistor 10. The output signal is at low voltage level when the input signal is at high voltage level and the clock signal is at low voltage level. Thus, the capacitor 14 is charged, and a voltage difference is generated on both sides of the capacitor 14. However, the turned on NMOS transistor 10 acts as a diode, which lowers the voltage level of the signal controlling the NMOS transistor 12.

The voltage level of the output signal is lowered when the NMOS transistor 16 is turned on. The NMOS transistor 16 is turned off and the input clock C1 starts to provide high-voltage level signal when the voltage difference of the capacitor 14 is higher than the threshold voltage of the NMOS transistor 12. Thus, the output terminal outputs high-voltage level signal to the next-stage shift-register unit and the output signal returns to low-voltage level when the NMOS transistor 16 is turned on again.

In addition, the NMOS transistor 18 is switched by the output signal of the next two-stage shift-register unit. When the NMOS transistor 18 is turned on, the voltage difference of the capacitor 14 rapidly decreases. Thus, the NMOS transistor 12 is turned off and the output terminal stops outputting the signal.

However, the circuit layout of the conventional shift-register circuit is complicated because feedback circuit is required. In addition, the circuit layout of the conventional shift-register circuit is more complicated because the feedback signal is provided by the next two-stage shift-register unit. In addition, the input signal is provided through the turned on NMOS transistor acting as a diode, so the voltage level of the signal is decreased and the tolerance of the conventional shift-register circuit deteriorates.

SUMMARY OF THE INVENTION

The object of the present invention is thus to provide a shift-register circuit without feedback circuit. The circuit layout of the shift-register circuit according to the present invention is thus simplified in addition to its tolerance being improved.

To achieve the above-mentioned object, the present invention provides a shift-register circuit having a plurality of shift-register units connected in serial for a clock signal, an inverse clock signal, and a ground voltage level. The PMOS transistor includes a first gate coupled to an inverse output signal output from a previous-stage shift-register unit, a first drain, and a first source coupled to an output signal output from the previous-stage shift-register unit. The first NMOS transistor includes a second gate coupled to the first drain, a second drain coupled to the clock signal, and a second source. The capacitor is coupled between the second gate and the second source. The second NMOS transistor includes a third gate coupled to the first drain, a third drain coupled to the inverse clock signal, and a third source. The third NMOS transistor includes a fourth gate coupled to the first source, a fourth drain coupled to the second source, and a fourth source coupled to the ground voltage level. The fourth NMOS transistor includes a fifth gate coupled to the first gate, a fifth drain coupled to the third source, and a fifth source. The fifth NMOS transistor includes a sixth gate coupled to the first source, a sixth drain coupled to the fifth source, and a sixth source coupled to the ground voltage level. The sixth NMOS transistor includes a seventh gate coupled to the sixth drain, a seventh drain coupled to the second gate, and a seventh source coupled to the ground voltage level. The seventh NMOS transistor has an eighth gate coupled to the sixth drain, an eighth drain coupled to the second source, and an eighth source coupled to the ground voltage level. The first inverter acts as an inverse output terminal and is coupled to the eighth drain for outputting an inverse output signal. The second inverter acts as an output terminal and is coupled to the first inverter for outputting an output signal.

In addition, the present invention provides another shift-register circuit having a plurality of shift-register units connected in serial for a clock signal, an inverse clock signal, and a ground voltage level. The PMOS transistor includes a first gate coupled to an inverse output signal output from a previous-stage shift-register unit, a first drain, and a first source coupled to an output signal output from the previous-stage shift-register unit. The first NMOS transistor includes a second gate coupled to the first drain, a second drain coupled to the clock signal, and a second source. The capacitor is coupled between the second gate and the second source. The second NMOS transistor includes a third gate coupled to the first drain, a third drain coupled to the inverse clock signal, and a third source. The third NMOS transistor includes a fourth gate coupled to the first gate, a fourth drain coupled to the second gate, and a fourth source. The fourth NMOS transistor includes a fifth gate coupled to the first source, a fifth drain coupled to the second source, and a fifth source coupled to the ground voltage level. The fifth NMOS transistor has a sixth gate coupled to the third source, a sixth drain coupled to the fourth source, and a sixth source coupled to the ground voltage level. The first inverter acts as an inverse output terminal and is coupled to the second source for outputting an inverse output signal. The second inverter acts as an output terminal and is coupled to the first inverter for outputting an output signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a shift-register circuit comprising a plurality of shift-register units. The detailed circuit of the shift-register unit is described in the following embodiments.

First Embodiment

Figure 1:
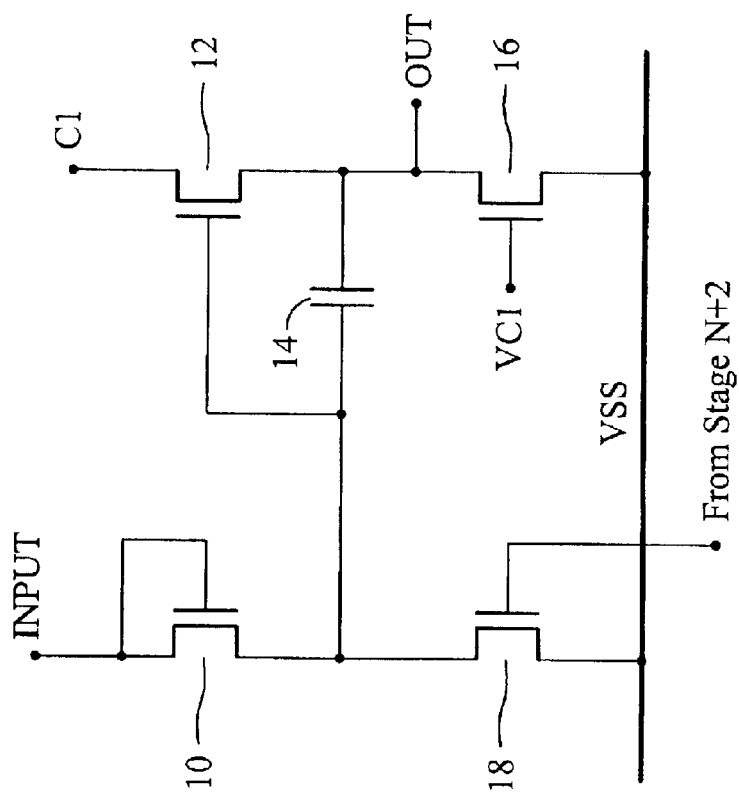
FIG. 1 shows a conventional shift-register circuit.
Figure 2:
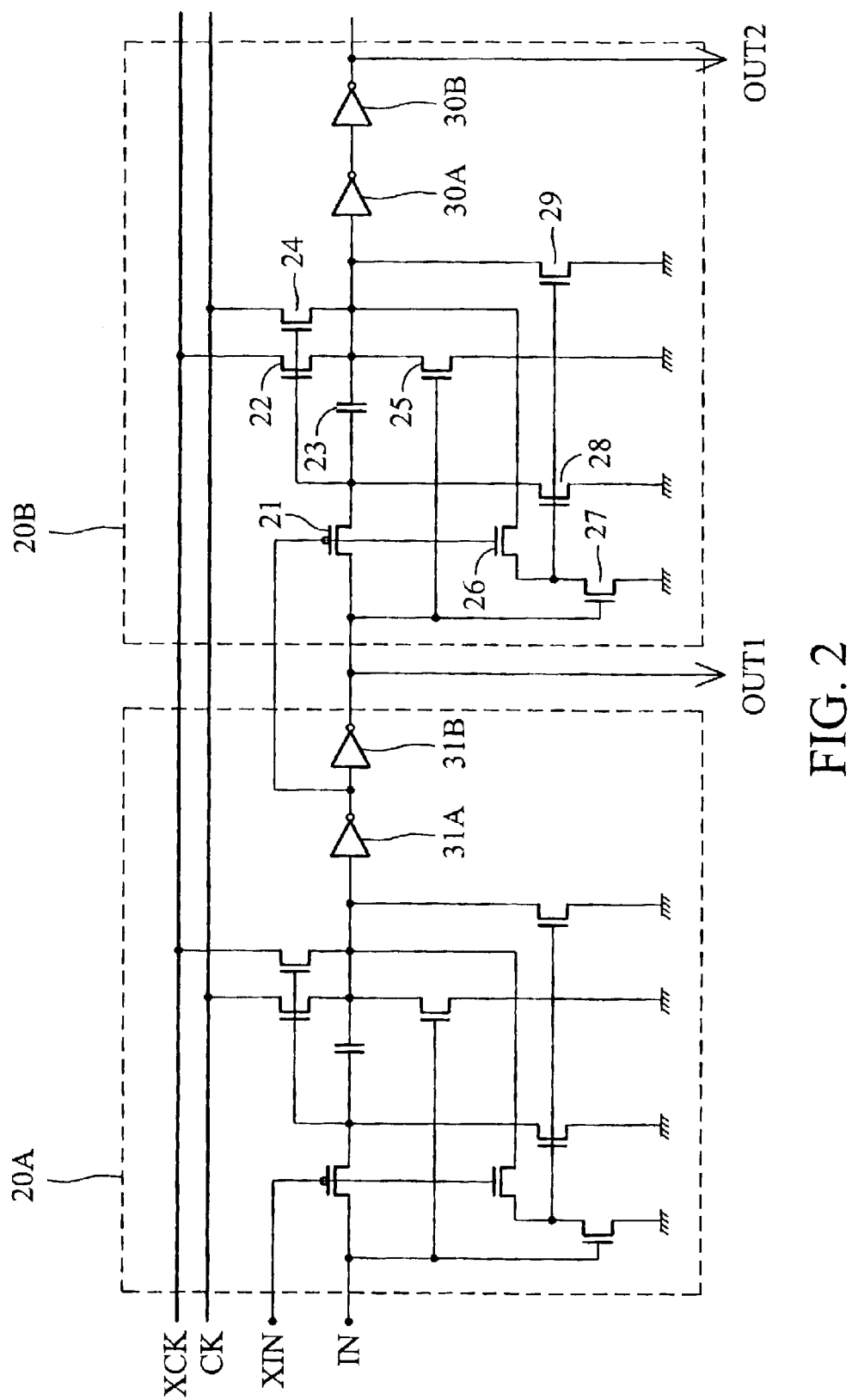
FIG. 2 shows a circuit of the shift-register unit according to the first embodiment of the present invention.

FIG. 2 shows the circuit of the serial shift-register unit according to the first embodiment of the present invention.

Labels 20A and 20B represent shift-register units connected in serial, respectively. Each shift-register unit comprises the same circuit, so only the circuit of the shift-register unit 20B is described. For example, the shift-register unit 20B is the (N)th stage of the shift-register circuit, and the shift-register unit 20A is the (N−1)th stage of the shift-register circuit.

The source of the PMOS transistor 21 is coupled to the output terminal OUT1 of the previous-stage shift-register unit 20A and receives the output signal output from the inverter 31B. The gate of the PMOS transistor 21 receives the inverse output signal output from the inverter 31A. The gate of the NMOS transistor 22 is coupled to the drain of the PMOS transistor 21, and its drain is coupled to the clock signal XCK. The capacitor 23 is coupled between the gate and the source of the NMOS transistor 22. The gate of the NMOS transistor 24 is coupled to the drain of the PMOS transistor 21 and its drain is coupled to the clock signal CK. Here, the clock signals CK and XCK are inverted.

The gate of the NMOS transistor 25 is coupled to the source of the PMOS transistor 21, its drain is coupled to the source of the NMOS transistor 22 and its source is coupled to the ground. The gate of the NMOS transistor 26 is coupled to the gate of the PMOS transistor 21 and its drain is coupled to the source of the NMOS transistor 24. The gate of the NMOS transistor 27 is coupled to the source of the PMOS transistor 21, its drain is coupled to the source of the NMOS transistor 26 and its source is coupled to the ground. The gate of the NMOS transistor 28 is coupled to the drain of the NMOS transistor 27, its drain is coupled to the gate of the NMOS transistor 22 and its source is coupled to the ground. The gate of the NMOS transistor 29 is coupled to the drain of the NMOS transistor 27, its drain is coupled to the source of the NMOS transistor 22 and its source is coupled to the ground. The inverter 30A is an inverse output terminal coupled to the drain of the NMOS transistor 29 for outputting an inverse output signal. The inverter 30B is an output terminal coupled to the inverter 30A for outputting an output signal OUT2.

Figure 3:
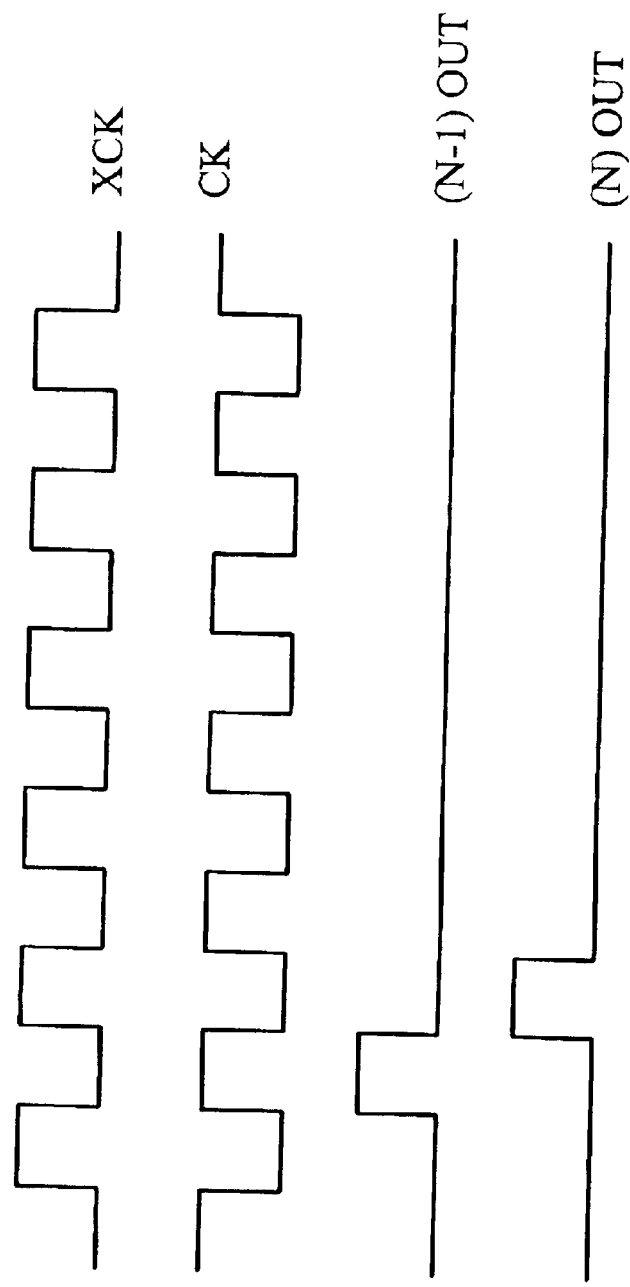
FIG. 3 shows a timing chart of the shift-register circuit according to the embodiment of the present invention.

The gate of the PMOS transistor 21 receives a low voltage level signal output from the inverter 31A of the shift-register unit 20A when the source of the PMOS transistor 21 of the N-th shift-register unit 20B receives the high voltage level signal output from the output terminal OUT1 of the (N−1)th shift-register unit 20A. Thus, the PMOS transistor 21 is turned on and charges the capacitor 23 by the high voltage level signal output from the output terminal OUT1 of the shift-register unit 20A. FIG. 3 shows a timing chart of the shift-register circuit according to the present invention. At this time, the NMOS transistors 22 and 25 are turned on and the clock signal XCK is at a low voltage level, so the connection point of the capacitor 23 and the NMOS transistors 22 and 25 are at a low voltage level, and the voltage level of the other side of the capacitor 23 is increased. Thus, voltage difference between the capacitor 23 is generated.

Next, the gate of the PMOS transistor 21 receives a high voltage-level signal output from the inverter 31A of the (N−1)th shift-register unit 20A when the source of the PMOS transistor 21 of the N-th shift-register unit 20B receives the low voltage-level signal output from the inverter 31B of the (N−1)th shift-register unit 20A. Thus, the PMOS transistor 21 and the NMOS transistors 25 and 27 are turned off. At this time, the voltage difference between the capacitor 23 turns on the NMOS transistor 22.

In FIG. 3, the clock signal XCK is at a high voltage level when the NMOS transistor 22 is turned on. Thus, the inverter 30A outputs low voltage-level signal and the inverter 30B outputs high voltage-level signal to enable the next-stage shift-register unit.

In addition, the voltage difference between the capacitor 23 turns on the NMOS transistor 24. Thus, the clock signal CK reaches a high voltage level and the NMOS transistors 28 and 29 are turned on when the next-stage shift-register unit is enabled. Thus, the voltage difference of the capacitor 23 is decreased and the shift-register unit 20B outputs low voltage-level signal at output terminal 30B.

In FIG. 3, the output OUT1 of the shift-register unit 31B is labeled (N−1)OUT and the output OUT2 of the shift-register unit 30B is labeled (N)OUT. As shown in FIG. 3, each shift-register unit of the shift-register circuit according to the embodiment of the present invention outputs a pulse after the previous stage shift-register unit outputs a pulse in a predetermined period. Thus, the requirement of the shift-register circuit is achieved.

Second Embodiment

Figure 4:
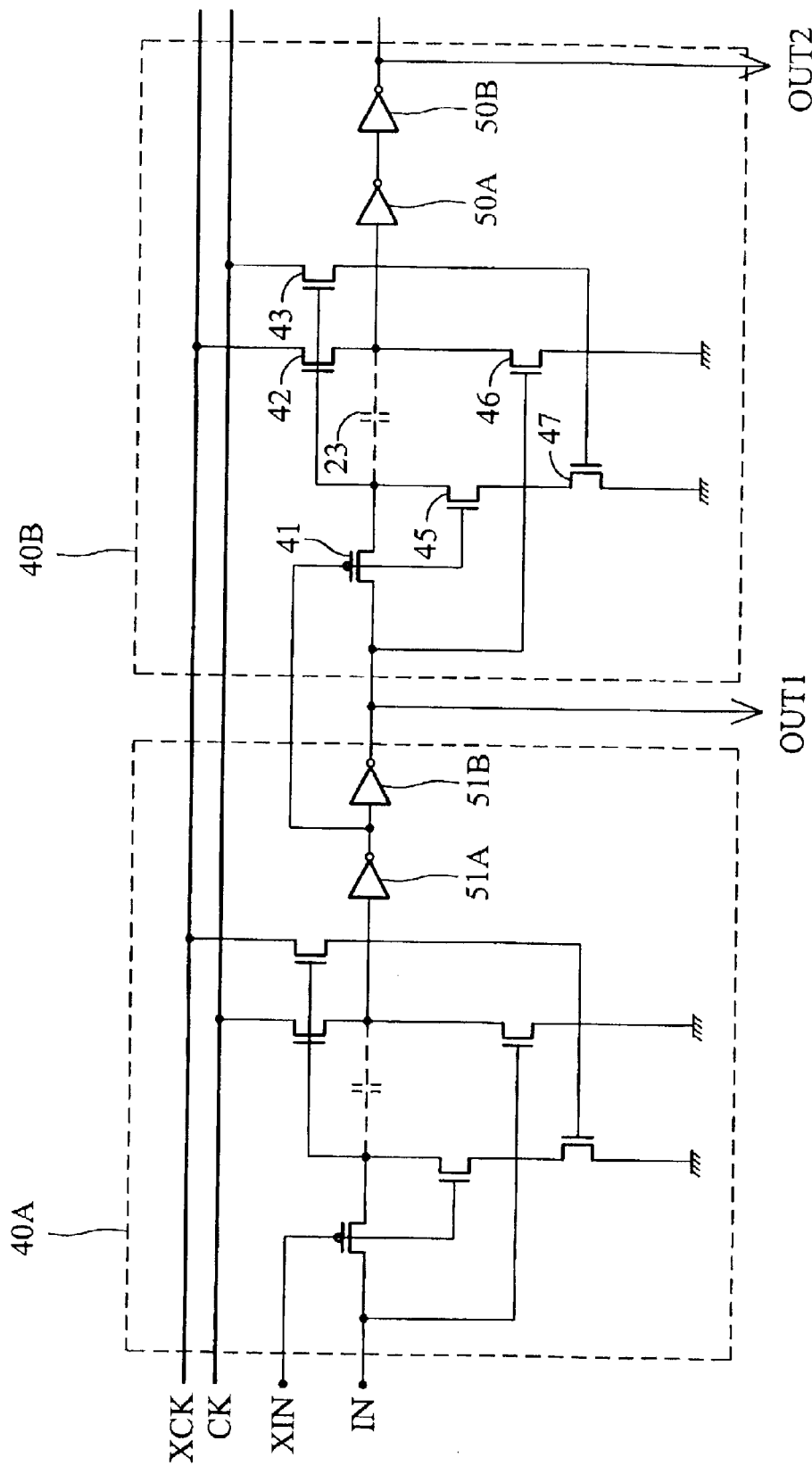
FIG. 4 shows a circuit of the shift-register unit according to the second embodiment of the present invention.

FIG. 4 shows the circuit of the serial shift-register unit according to the second embodiment of the present invention. Labels 40A and 40B represent shift-register units connected in serial, respectively. Each shift-register unit comprises the same circuit, so only, the circuit of the shift-register unit 40B is described. For example, the shift-register unit 40B is the (N) th stage of the shift-register circuit, and the shift-register unit 40A is the (N−1)th stage of the shift-register circuit.

The source of the PMOS transistor 41 is coupled to the output terminal OUT1 of the previous-stage shift-register unit 40A and receives the output signal output from the inverter 51B. The gate of the PMOS transistor 41 receives the inverse output signal output from the inverter 51A. The gate of the NMOS transistor 42 is coupled to the drain of the PMOS transistor 41, and its drain is coupled to the clock signal XCK. The capacitor 44 is coupled between the gate and the source of the NMOS transistor 42. The gate of the NMOS transistor 43 is coupled to the drain of the PMOS transistor 41 and its drain is coupled to the clock signal CK. Here, the clock signals CK and XCK are inverted.

The gate of the NMOS transistor 45 is coupled to the gate of the PMOS transistor 41 and its drain is coupled to the gate of the NMOS transistor 42. The gate of the NMOS transistor 46 is coupled to the source of the PMOS transistor 41, its drain is coupled to the source of the NMOS transistor 42 and its source is coupled to the ground. The gate of the NMOS transistor 47 is coupled to the source of the NMOS transistor 43, its drain is coupled to the source of the NMOS transistor 45 and its source is coupled to the ground. The inverter 50A is an inverse output terminal coupled to the drain of the NMOS transistor 46 for outputting an inverse output signal. The inverter 50B is an output terminal coupled to the inverter 50A for outputting an output signal OUT2.

The gate of the PMOS transistor 41 receives a low voltage level signal output from the inverter 51A of the shift-register unit 40A when the source of the PMOS transistor 41 of the N-th shift-register unit 40B receives the high voltage-level signal output from the output terminal OUT1 of the (N−1)th shift-register unit 40A. Thus, the PMOS transistor 21 is turned on and charges the capacitor 44 by the high voltage level signal output from the output terminal OUT1 of the shift-register unit 40A. FIG. 3 shows a timing chart of the shift-register circuit according to the present invention. At this time, the NMOS transistors 42 and 46 are turned on and the clock signal XCK is at a low voltage level, so the connection point of the capacitor 44 and the NMOS transistors 42 and 46 is at a low voltage level, and the voltage level of the other side of the capacitor 44 is increased. Thus, voltage difference between the capacitor 23 is generated.

Next, the gate of the PMOS transistor 41 receives a high voltage-level signal output from the inverter 51A of the (N−1)th shift-register unit 40A when the source of the PMOS transistor 41 of the N-th shift-register unit 40B receives the low voltage-level signal output from the inverter 51B of the (N−1)th shift-register unit 40A. Thus, the PMOS transistor 41 and the NMOS transistor 46 are turned off. At this time, the voltage difference between the capacitor 44 turns on the NMOS transistors 42 and 43.

In FIG. 3, the clock signal XCK is at a high voltage level when the NMOS transistor 42 is turned on. Thus, the inverter 50A outputs low voltage-level signal and the inverter 50B outputs high voltage-level signal to enable the next-stage shift-register unit. In addition, the clock signal CK is at a low voltage level, so the NMOS transistor 47 is turned off. Thus, even when the NMOS transistor 47 is turned on, the voltage difference between the capacitor does not decrease.

In addition, the voltage difference between the capacitor 44 turns on the NMOS transistor 43. Thus, the clock signal CK reaches a high voltage level and the NMOS transistor 47 is turned on when the next-stage shift-register unit is enabled. The voltage difference of the capacitor 44 is thus decreased and the shift-register unit 40B outputs low voltage-level signal at output terminal 50B.

In FIG. 3, the output OUT1 of the shift-register unit 51B is labeled (N−1)OUT and the output OUT2 of the shift-register unit 30B is labeled (N)OUT. As shown in FIG. 3, each shift-register unit of the shift-register circuit according to the embodiment of the present invention outputs a pulse after the previous stage shift-register unit outputs a pulse in a predetermined period. Thus, the requirement of the shift-register circuit is achieved.

Accordingly, the present invention provides shift-register circuits without feedback circuit. Thus, the circuit layout of the shift-register circuit according to the present invention is simplified, and its tolerance is improved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A shift-register circuit having a plurality of shift-register units connected in serial for a clock signal, an inverse clock signal, and a ground voltage level, comprising:

a PMOS transistor having a first gate coupled to an inverse output signal output from a previous-stage shift-register unit, a first drain, and a first source coupled to an output signal output from the previous-stage shift-register unit;

a first NMOS transistor having a second gate coupled to the first drain, a second drain coupled to the clock signal, and a second source;

a capacitor coupled between the second gate and the second source;

a second NMOS transistor having a third gate coupled to the first drain, a third drain coupled to the inverse clock signal, and a third source;

a third NMOS transistor having a fourth gate coupled to the first source, a fourth drain coupled to the second source, and a fourth source coupled to the ground voltage level;

a fourth NMOS transistor having a fifth gate coupled to the first gate, a fifth drain coupled to the third source, and a fifth source;

a fifth NMOS transistor having a sixth gate coupled to the first source, a sixth drain coupled to the fifth source, and a sixth source coupled to the ground voltage level;

a sixth NMOS transistor having a seventh gate coupled to the sixth drain, a seventh drain coupled to the second gate, and a seventh source coupled to the ground voltage level;

a seventh NMOS transistor having an eighth gate coupled to the sixth drain, an eighth drain coupled to the second source, and an eighth source coupled to the ground voltage level;

a first inverter acting as an inverse output terminal coupled to the eighth drain for outputting an inverse output signal; and a second inverter acting as an output terminal coupled to the first inverter for outputting an output signal.

2. The shift-register circuit as claimed in claim 1, wherein the NMOS and PMOS transistors are thin film transistors.

3. The shift-register circuit as claimed in claim 1, wherein the capacitor is a MOS capacitor.

4. The shift-register circuit as claimed in claim 1, wherein the first and second inverters are CMOS inverters.

5. A shift-register circuit having a plurality of shift-register units connected in serial for a clock signal, an inverse clock signal, and a ground voltage level, comprising:

a PMOS transistor having a first gate coupled to an inverse output signal output from a previous-stage shift-register unit, a first drain, and a first source coupled to an output signal output from the previous-stage shift-register unit;

a first NMOS transistor having a second gate coupled to the first drain, a second drain coupled to the clock signal, and a second source;

a capacitor coupled between the second gate and the second source;

a second NMOS transistor having a third gate coupled to the first drain, a third drain coupled to the inverse clock signal, and a third source;

a third NMOS transistor having a fourth gate coupled to the first gate, a fourth drain coupled to the second gate, and a fourth source;

a fourth NMOS transistor having a fifth gate coupled to the first source, a fifth drain coupled to the second source, and a fifth source coupled to the ground voltage level;

a fifth NMOS transistor having a sixth gate coupled to the third source, a sixth drain coupled to the fourth source, and a sixth source coupled to the ground voltage level;

a first inverter acting as an inverse output terminal coupled to the second source for outputting an inverse output signal; and a second inverter acting as an output terminal coupled to the first inverter for outputting an output signal.

6. The shift-register circuit as claimed in claim 5, wherein the NMOS and PMOS transistors are thin film transistors.

7. The shift-register circuit as claimed in claim 5, wherein the capacitor is a MOS capacitor.

8. The shift-register circuit as claimed in claim 5, wherein the first and second inverters are CMOS inverters.

* * * * *